United States Patent [19]
Doll et al.

[11] Patent Number: 5,164,810
[45] Date of Patent: Nov. 17, 1992

[54] CUBIC BORON NITRIDE BIPOLAR TRANSISTOR

[75] Inventors: Gary L. Doll, Southfield; Larry E. Henneman, Jr., Richmond, both of Mich.

[73] Assignee: General Motors Corporation, Detroit, Mich.

[21] Appl. No.: 703,939

[22] Filed: May 22, 1991

Related U.S. Application Data

[60] Continuation-in-part of Ser. No. 523,951, May 16, 1990, which is a division of Ser. No. 446,758, Dec. 6, 1989, abandoned.

[51] Int. Cl.⁵ .............................................. H01L 29/72
[52] U.S. Cl. ...................................... 257/76; 257/198
[58] Field of Search .................................. 357/61, 34

[56] References Cited

U.S. PATENT DOCUMENTS 4,980,730 12/1990 Mishima et al. .................... 357/61

OTHER PUBLICATIONS

Doll et al–"The Growth and Characterization of Epitaxial Cubic Boron Nitride Films on Silicon"–Oct. 25, 1990–Physical Review Letters.

Doll et al–"X-Ray Diffraction Study of Cubic Boron Nitride Grown Epitaxially on Silicon"–1990–Materials Research Society, Boston, Mass.

Lin et al–Thin Solid Films, vol. 153, No. 1, Oct. 26, 1987 pp. 487–496.

Electronics Letters, vol. 25, No. 23, Nov. 9, 1989, pp. 1602–1603; T. K. Paul et al.: "Laser-assisted deposition of BN films on InP for MIS applications".

Thin Solid Films, vol. 153, Oct. 26, 1987, pp. 487–496; P. Lin et al.: "Preparation and properties of cubic boron nitride coatings".

Primary Examiner—Edward J. Wojciechowicz
Attorney, Agent, or Firm—Cary W. Brooks

[57] ABSTRACT

A bipolar transistor is formed from epitaxial cubic boron nitride grown on a silicon substrate which is a three to two commensurate layer deposited by pulsed laser evaporation techniques. The thin film, cubic boron nitride bipolar transistor is in epitaxial registry with an underlying single crystal silicon substrate. The bipolar transistor is particularly suitable for high temperature applications.

5 Claims, 1 Drawing Sheet

CUBIC BORON NITRIDE BIPOLAR TRANSISTOR

This is a continuation-in-part of U.S. Ser. No. 07/523,951, filed May 16, 1990, which is a divisional of U.S. Ser. No. 07/446,758, filed Dec. 6, 1989, now abandoned and the benefit of the filing date of each is hereby claimed.

This invention generally relates to transistors used in microelectronic applications. More specifically, this invention relates to a bipolar transistor which may be particularly useful for high temperature and other high performance applications and which is formed from cubic boron nitride material, wherein the cubic boron nitride material is formed using pulsed laser evaporation methods so as to be in epitaxial registry with an underlying single crystal silicon substrate.

BACKGROUND OF THE INVENTION

Materials such as diamond and cubic silicon carbide, which are characterized by large electron valance band gaps, are intrinsically superior to silicon, germanium, or most of the III-V compounds for high temperature, high performance electronic devices. This is because their wide electron valence-to-conduction band gaps require a large amount of energy input before the electrons will move between the bands. The band gap refers to the energy difference between the uppermost point of the valence band and the lowest point of the conduction band within the band structure for the material. Therefore, these materials can tolerate a great input of thermal energy, resulting from exposure to extremely high temperatures, with a minimal amount of electron movement between the electron bands. This is not the case with silicon, germanium or conventional III-V materials wherein the band gaps are narrow, thereby requiring a significantly smaller amount of thermal energy to force the movement of electrons between bands. Accordingly these conventional materials can not operate effectively in semiconductor applications at elevated temperatures. As an illustrative example, a conventional CMOS type of device can not operate at temperatures over about 250° C.

However, even though diamond and cubic silicon carbide possess this potential advantage for high temperature use, transistors from these materials have not proven feasible. Diamond-based transistors have not been realized in practice because the process of doping the diamond to form an electrically conductive n-type material has proven to be extremely difficult. Furthermore, regardless of the deposition procedure used, diamond films are unsatisfactory for electronic applications because of their polycrystalline structure and their tendency toward rough, multifaceted surfaces. In addition, diamond films cannot be grown epitaxially on any substrates other than diamond and cubic boron nitride, which severely hampers its usefulness.

Although the development of cubic silicon carbide is further along than the development of diamond, problems associated with the final film quality and the doping, etching, and oxidation of the films, are also imposing to device development. As for the silicon carbide, films of this material that are grown on silicon have rather poor properties because of the crystallographic lattice mismatch between the materials. As a result, other substrate materials with better lattice matching parameters are being investigated. Therefore, diamond- and silicon carbide-based electronic devices, although theoretically advantageous, are not likely to replace the current silicon- or germanium- based devices until the properties of these films can be improved substantially.

As an alternative III-V material, Boron Nitride (BN) is particularly interesting from both the practical and scientific viewpoints. Boron nitride is characterized by at least three different crystal structures: hexagonal, wurtzite and cubic zincblende. The boron nitride phase having the cubic zincblende crystal structure is particularly useful since it is characterized by many desirable physical properties which are comparable to diamond, including high electrical resistivity and high thermal conductivity. In addition, the cubic zincblende crystallographic phase of boron nitride is relatively inert chemically.

Because of these properties, this cubic form of boron nitride is potentially very useful as a replacement for diamond in electronic devices. Since the physical properties of cubic boron nitride are comparable to diamond, cubic boron nitride-based devices should be capable (like diamond) of operating at higher temperatures, higher speeds, and higher output powers, as compared to similar devices formed from silicon, germanium or conventional III-V materials.

A bipolar transistor is the most commonly used device in microelectronic applications and is an example of the type of device in which the cubic boron nitride material may be useful. Bipolar transistors are used routinely in integrated circuits as resistors, capacitors and diodes. In addition, bipolar transistors are commonly used as power transistors, high frequency microwave transistors and switching transistors. Although there is no well defined boundary between power transistors and microwave transistors, typically power gain and efficiency are the prime considerations for a power transistor while cutoff frequency and noise are the prime considerations for a microwave transistor which generally performs small-signal amplification. Alternatively, a switching transistor must be able to switch from a high-voltage low-current (on) condition to a low-voltage high current (off) condition over a very short time period. Therefore the most important considerations for a switching transistor are current gain and switching time.

In order to determine a suitable material for use in these types of devices which incorporate bipolar transistors yet which have widely divergent considerations, the Johnson and Keyes figures of merit may be used for evaluating the various types of semiconducting materials. Generally, the Johnson and Keyes figures of merit are commonly used throughout the industry and evaluate a material based on several criteria, including factors such as the dielectric breakdown voltage and the saturated charge carrier velocity of the material. The Johnson portion of this scale evaluates the usefulness of a semiconductor material as a high-power amplifier of microwaves and millimeter-waves. The Keyes portion of the scale evaluates the usefulness of the semiconductor material in dense, integrated circuit applications.

When diamond is evaluated using this scale, the Johnson and Keyes figures respectively indicate that diamond is approximately 8000 and 32 times better than silicon for these various applications. Although some of the physical properties necessary to calculate these Johnson and Keyes figures of merit are unknown for cubic boron nitride, it is expected that the Johnson and Keyes figures for cubic boron nitride are also similar to diamond since the properties of the cubic boron nitride are so similar to that of diamond. Therefore, it would appear to be advantageous to provide a bipolar transistor formed from the cubic boron nitride material.

In addition, the dielectric strength of cubic boron nitride is greater than $10^7$ Volts cm$^{-1}$, as compared to a dielectric strength of $5 \times 10^5$ Volts cm$^{-1}$ for silicon. This factor of 20 increase in the dielectric strength of the cubic boron nitride would result in a bipolar transistor having a potential power output increase of about 400 times that of a similar silicon-based device. Again, it appears that a bipolar transistor formed from the cubic boron nitride is needed and could be extremely advantageous for these high power device applications.

It is also to be noted that the transistor speed of a semiconductor material is affected by various factors, including the dielectric constant of the material and the charge carrier mobility and velocity, as well as other factors. In particular, the dielectric constant of the material determines the parasitic capacitance of the transmission lines within an integrated circuit, and therefore the transistor speed is inversely related to the dielectric constant of the semiconductor material. Based on the dielectric constants for the various materials, cubic boron nitride transistors have the potential of being 1.7 and 1.8 times faster than silicon and germanium transistors, respectively. Thus, it would be potentially advantageous to use transistors formed from cubic boron nitride for computers or other applications where a higher speed is required.

Also, just as diamond is characterized by a large band gap between electron bands, so is cubic boron nitride. The large band gap of cubic boron nitride, which is greater than 6 electron volts, minimizes the thermally induced and random movement by electrons between valence shells within the elements. This enables a cubic boron nitride device to operate at extremely high temperatures, such as for example 1000° C. or higher. In practice, the upper operating temperatures will be limited primarily by the temperature limitations imposed by the metallization used for making the ohmic and/or Schottky contacts to the cubic boron nitride semiconductors. Therefore it is obvious that cubic boron nitride transistors have the potential to enjoy widespread use in high temperature applications, as well as in a multitude of various other applications.

Unfortunately, conventional methods for growing cubic boron nitride films have been even less successful than the methods used to produce diamond films. Until recently, the most successful of these methods has been ion beam deposition. Boron nitride films grown by this method exhibit the cubic structure and appear to contain only a single phase. However, the films also exhibit the same morphology as diamond films in that they have rough, polycrystalline surfaces.

Recently though, smooth epitaxial films of cubic boron nitride have been successfully grown on silicon wafers by means of a pulsed laser evaporation technique, as disclosed in United States Patent application Ser. No. 07/446,758 to Gary L. Doll et al., entitled "Laser Deposition of Crystalline Boron Nitride Films", filed on Dec. 6, 1989, and assigned to the same assignee of this patent application. With this pulsed laser evaporation method, cubic boron nitride films were epitaxially grown on a silicon substrate oriented along the [100] axis.

Therefore, it would be advantageous to provide a cubic boron nitride bipolar transistor, which may be suitable for use in various electronic applications, including high temperature and high performance semiconductor devices. It would also be advantageous to form such a cubic boron nitride bipolar transistor using pulsed laser evaporation techniques.

SUMMARY OF THE INVENTION

It is an object of the present invention to provide a bipolar transistor formed from epitaxial cubic boron nitride which may be suitable for use at high temperatures and in high performance applications.

It is a further object of this invention that such a bipolar transistor be formed from a thin film of the epitaxial cubic boron nitride material, wherein the thin film, cubic boron nitride material is in epitaxial registry with an underlying single crystal silicon substrate.

It is still a further object of this invention that the epitaxial cubic boron nitride material within the bipolar transistor be formed using pulsed laser evaporation techniques.

In accordance with a preferred embodiment of this invention, these and other objects and advantages are accomplished as follows.

A bipolar transistor is formed from epitaxial cubic boron nitride which is deposited by pulsed laser evaporation techniques. The thin film, cubic boron nitride bipolar transistor is in epitaxial registry with an underlying single crystal silicon substrate.

A first thin film layer of cubic boron nitride is epitaxially deposited onto a single crystal silicon substrate oriented along the [100] crystallographic plane using pulsed laser evaporation methods. This thin film of cubic boron nitride is patterned so as to form the collector region for the bipolar transistor. The cubic boron nitride collector region is appropriately doped to be either of n-type conductivity, preferably for a n-p-n bipolar transistor, or alternatively p-type conductivity for a p-n-p bipolar transistor. The collector region is in crystallographic registry with the silicon substrate.

A second thin film layer of cubic boron nitride is then epitaxially grown on the collector region using the pulsed laser evaporation techniques. This second layer is patterned to provide the base for the bipolar transistor. The base region is appropriately doped to be of opposite electrical conductivity type as compared to the collector region, therefore either p-type conductivity for an n-p-n bipolar transistor or n-type conductivity for a p-n-p bipolar transistor.

A third thin film layer of the cubic boron nitride is then epitaxially grown on the base region using the pulsed laser evaporation techniques. This third layer is patterned to provide the emitter region for the bipolar transistor. Similarly, this emitter region is appropriately doped to be of the same electrical conductivity type as the collector region and accordingly of opposite conductivity type as the base region, therefore either n-type conductivity for an n-p-n bipolar transistor or p-type conductivity for a p-n-p bipolar transistor.

Lastly, electrical contacts are formed by conventional metallization techniques so as to electrically contact the collector, base and emitter regions.

Generally, the pulsed laser evaporation method employed is as follows. A boron nitride target is provided on a rotating turntable and located in proximity to the single crystal silicon substrate within a stainless steel 6-way cross chamber which is evacuated to an appropriate pressure. The n-type single crystal silicon substrate is heated to approximately 500° C. and maintained at that temperature during the process. A KrF excimer laser source operating at a wavelength of approximately 248 nanometers and an appropriate frequency is used as the ablating beam. The KrF excimer laser source which is outside the chamber, passes through a transparent window prior to incidence upon the boron nitride target. As the laser beam strikes the boron nitride target, the target material is ablated, resulting in concurrent evaporation of the boron nitride material and almost simultaneous deposition of the boron nitride onto the silicon substrate. The depositions are conducted in ultra high purity nitrogen gas and at various laser fluences ranging from about 1.5 to about 5.2 Joules/centimeter$^2$. The resulting boron nitride films exhibit the desired cubic phase and are in epitaxial registry with the underlying silicon substrate.

A particularly advantageous feature of this invention is that the properties of the epitaxial cubic boron nitride material should enable the bipolar transistor to be particularly useful for high temperature, high frequency, high power and high speed electronic applications, especially when compared with comparable devices formed from conventional materials. In addition, the crystallographic lattice constants between the underlying single crystal silicon substrate and the overlaying layers of cubic boron nitride are nearly matched, with three cubic boron nitride crystallographic lattice constants approximately equal to two silicon crystallographic lattice constants. Therefore stresses which may occur during use due to mismatched lattice constants are minimized. Further, since the thermal expansion coefficient of cubic boron nitride is similar to silicon over a large temperature range, a cubic boron nitride-on-silicon transistor should minimize the amount of thermally induced stresses due to differences in coefficients of expansion and therefore should easily lend itself to many applications. Lastly, the large dielectric breakdown voltage and superior thermal properties of cubic boron nitride should also provide a higher device yield per silicon wafer since the cubic boron nitride transistors can be made smaller than conventional transistors.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawing wherein.

DETAILED DESCRIPTION OF THE PREFERRED EMBODIMENTS

We are the first to provide a bipolar transistor formed from epitaxial cubic boron nitride which overlays a single crystal silicon substrate, and wherein the cubic boron nitride is deposited using pulsed laser evaporation techniques.

The pulsed laser evaporation method used for forming the single crystal, cubic boron nitride material is generally described as follows and is fully described in the aforementioned copending U.S. Patent application, Ser. No. 07/446,758 to Gary L. Doll et al., entitled "Laser Deposition of Crystalline Boron Nitride Films", which is incorporated herein by reference.

Figure 1:
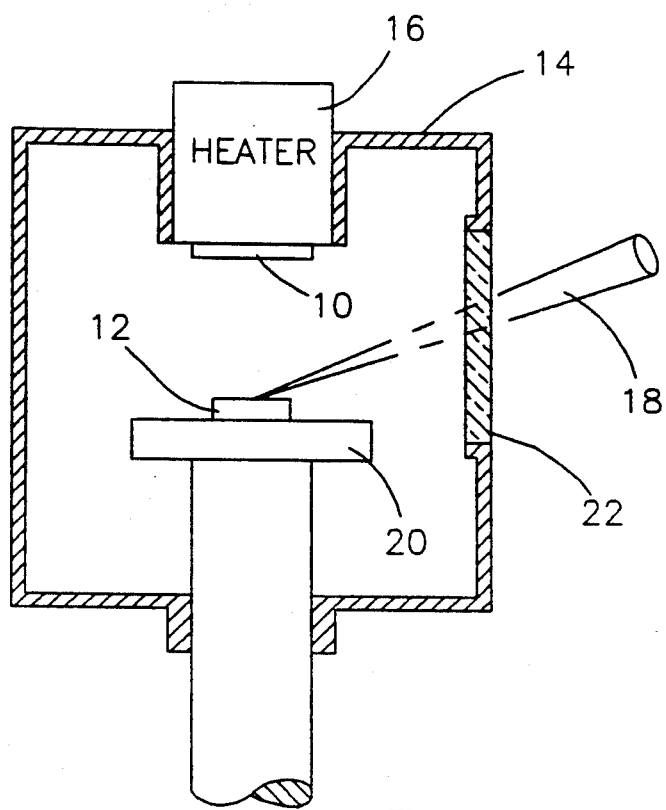
FIG. 1 schematically illustrates the preferred pulsed laser evaporation setup in accordance with this invention for the formation of thin films of cubic boron nitride which are epitaxially oriented upon a single crystal silicon substrate.

As shown schematically in accompanying FIG. 1, a single crystal silicon substrate 10 oriented throughout along its [100]crystallographic axis was provided. A boron nitride target 12 containing polycrystalline, hexagonal or cubic, boron nitride was provided on a rotating turntable 20 and located proximate to the single crystal silicon substrate 10, about 4 centimeters away, within a stainless steel 6-way cross chamber 14 which was evacuated to a pressure of less than $10^{-4}$ Torr. The n-type electrical conductivity, single crystal silicon substrate 10 was heated by a heater 16 to approximately 500° C. and maintained there during the evaporation and deposition process. A KrF excimer laser source (the laser beam is depicted as 18) operating at a standard wavelength of approximately 248 nanometers and a frequency of approximately 10 pulses per second was used as the ablating beam. The laser beam 18 emitted from the excimer laser source outside the chamber 14, passed through a transparent window 22 prior to incidence upon the hexagonal or cubic BN target 12. The depositions were conducted in ultra high purity nitrogen gas and at various laser fluences ranging from about 1.5 to about 5.2 Joules/centimeter$^2$ (J/cm$^2$). The boron nitride films formed using this method were epitaxially oriented and of the desired cubic phase.

More specifically, a single crystal silicon wafer oriented along its [100] crystallographic axis and appropriately doped to be electrically conductive n-type was provided. The wafer was cut into approximately one square centimeter pieces, cleaned with solvents, and etched in a dilute hydrofluoric acid solution to remove the native silicon dioxide. An individual silicon piece or substrate 10 was mechanically attached to the heater 16 and heated to above 400° C. This temperature was maintained during the deposition process. Theoretically, deposition may occur using substrate temperatures as high as the melting point of the silicon substrate. However in practice the upper limit appears to be about 700° C., since above this temperature the mismatch between the thermal coefficients of expansion of the silicon and the cubic boron nitride become significant to film growth, resulting in diminished film quality. The lower limit for the substrate temperature during deposition appears to be about 400° C. since below this temperature the substrate tends to become hygroscopic. The optimum deposition parameters appear to be obtained when the substrate is heated to about 500° C., wherein the epitaxial cubic phase is formed substantially uniformly throughout. Since the substrate must be heated in order to promote the deposition process and ensure adequate adhesion between the silicon substrate 10 and overlaying boron nitride material, a temperature of lower than about 400° C. should be avoided.

The laser depositions were performed in a stainless steel 6-way cross chamber 14 which was, evaluated by a turbomolecular pump to approximately $3 \times 10^{-4}$ Torr pressure. The target 12, a piece of, hexagonal or cubic, ceramic boron nitride material, was rotated during the laser ablation process to prevent excessive cratering within the target 12 from the laser beam 18/target 12 interaction. A KrF excimer laser operating at a wavelength of approximately 248 nanometers and a frequency of approximately 10 pulses per second, which are the standard operating parameters for this type of laser, was used as the ablating beam (depicted as 18). The target 12 to substrate 10 separation was approximately 4 centimeters, but may vary between about 2.5 centimeters and greater than 4 centimeters depending upon the operating parameters of the particular laser employed. Certainly, the substrate 10 must be close enough to the target 12 so that the evaporating target 12 material will contact the substrate 10, yet far enough away from the target 12 to allow free movement of the evaporated target 12 material. It appears that a distance between the target 12 and substrate 10 of between about 2.5 and about 4.0 centimeters is optimal, with about 4.0 centimeters being preferred for this type of KrF excimer laser operating at these particular parameters.

The laser ablations of the boron nitride target 12 were conducted within the evacuated chamber 14 in the presence of ultra high purity, i.e., approximately 99.99995%, nitrogen gas flowing at 10 standard cubic centimeters/minute (sccm). For the present chamber 14 geometry, this resulted in an ambient pressure of approximately 35 mTorr at the deposition surface of the silicon substrate 10. The presence of the nitrogen gas serves to limit the size of the plasma plume generated by the interaction between the laser beam 18 and the target 12, and to increase the nitrogen concentration of the deposited films making the nitrogen nearly stoichiometric with the boron. Therefore, the flow rate of the nitrogen gas will depend on the particular geometry of the chamber employed. After the deposition of the boron nitride onto the silicon substrate 10, the film and substrate 10 were cooled in flowing nitrogen to room temperature.

The laser ablation of the boron nitride target 12 was conducted at various laser fluences ranging from approximately 1.5 to 5.2 J/cm$^2$. In a separate experiment, the minimum threshold fluence for evaporation of the hexagonal boron nitride target 12 was determined to be approximately 0.31 to 0.34 J/cm$^2$. Therefore, the boron nitride target 12 was ablated at laser fluences significantly greater than the minimum threshold required, which ensures adequate amounts of evaporated boron nitride material for contact with the substrate 10.

The thickness of the boron nitride thin films as determined by stylus profilometry, were found to vary linearly with laser fluence The thickness was also found to be linearly dependent on the number of laser pulses. At a laser fluence of approximately 3.9 J/cm$^2$, an average deposition rate of approximately 0.182 Angstroms per pulse was measured. For a 12,000 pulse run and a laser fluence of approximately 1.5 J/cm$^2$, a film was produced having a thickness of approximately 1760 Angstroms. Practically any thickness of the epitaxial cubic boron nitride could be theoretically formed for use in this bipolar transistor.

The resulting cubic boron nitride layer was characterized by a cubic structure having an approximately 3.6 Angstrom lattice constant. In this preferred orientation, the crystallographic axes of the cubic boron nitride are all aligned with the corresponding silicon axes. Therefore, two silicon lattices, each with a lattice constant of about 5.43 Angstroms, accommodate three cubic boron nitride lattices with a lattice mismatch of less than about 0.13%. In this configuration, either the boron or the nitrogen atoms will align themselves over the silicon atoms, resulting in a matched morphological interface between the silicon and cubic boron nitride layer. This orientation is extremely advantageous since the matched interface between the silicon and cubic boron nitride layers minimizes any stresses due to a mismatched lattice and results in a higher quality interface and corresponding higher quality transistor.

Figure 2:
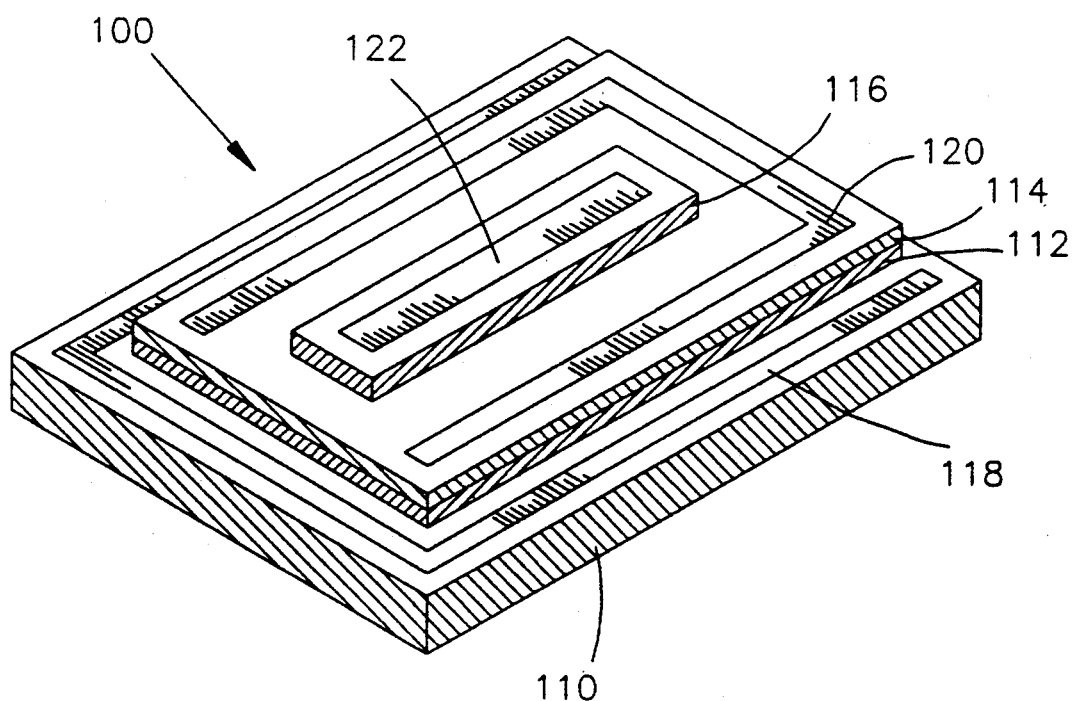
FIG. 2 schematically illustrates the cubic boron nitride bipolar transistor formed using the pulsed laser evaporation methods.

Shown schematically in FIG. 2 is the bipolar transistor 100 formed entirely by this pulsed laser evaporation method described herein. The bipolar transistor 100 is formed from epitaxial cubic boron nitride which is in epitaxial registry with an underlying single crystal silicon substrate 110. Conventional metal contacts 118, 120 and 122 are formed to make electrical contact with the collector 112, base 114 and emitter 116 regions respectively.

Specifically, first a relatively thick layer 112 of the epitaxial cubic boron nitride is deposited upon the single crystal silicon substrate 110 using the above-described pulsed laser evaporation method. This first layer 112 must be sufficiently thick so as to uniformly promote subsequent cubic boron nitride growth and can be grown to a thickness of up to about one micron. However, it is not necessary that the layer 112 be as thick as one micron, since theoretically a layer as thin as only a few Angstroms is enough to support subsequent growth. However, a layer this thin may have a relatively high level of residual stress within it due to the small crystallographic lattice mismatch between the silicon substrate 110 and the cubic boron nitride. Therefore, it is desirable that this first layer 112 of cubic boron nitride be relatively thick, i.e., about three to four thousand Angstroms, so as to provide a stress-free surface on which to grow the subsequent cubic boron nitride layers. In addition, because the cubic boron nitride has a high thermal conductivity coefficient, it is desirable to make this first layer 112 as thick as a micron so as to ensure good thermal conductivity characteristics for the final bipolar transistor 100.

This first epitaxial layer 112 of cubic boron nitride will function as the collector within the bipolar transistor 100 and is grown using the laser evaporation method through a conventional mask provided directly onto a doped [100] silicon wafer 110, which takes advantage of existing silicon processing technology. The first epitaxial layer 112 of cubic boron nitride, or collector region, is preferably doped to be electrically conductive n-type material so as to form an n-p-n bipolar transistor 100. By doping this collector region 112 of cubic boron nitride with preferably silicon, sulfur or another column VI element, the cubic boron nitride can be made n-type. For a standard bipolar transistor 100, the level of n-type doping would be about $10^{15}$ cm$^{-3}$, but could be doped to an alternative level required for a particular application. In addition, the silicon substrate 110 should be doped electrically conductive n$^+$ type, about $10^{19}$ cm$^{-3}$, using conventional techniques, in order to make continuous electrical contact to the n-type cubic boron nitride layer 112.

One possible way to obtain this n-type collector region 112 is to first form a silicon-doped boron nitride ceramic composite that can be used as the target (10 in FIG. 1) in the pulsed laser evaporation process. The level of doping within the target 10 would correspond to the desired application and level of doping within the collector 112. Other possible methods to obtain the n-type collector layer 112 include conventional diffusion and ion implantation techniques.

A second thin film layer 114 of epitaxial cubic boron nitride is then epitaxially grown on the first layer 112 of epitaxial cubic boron nitride, or collector region, using the preferred pulsed laser evaporation method, although other methods could foreseeably be used instead such as by reactive sputtering or ion beam deposition methods. This second layer 114 of epitaxial cubic boron nitride provides the base for the bipolar transistor 100 and is grown through the same mask provided on the underlying single crystal silicon substrate 110 which was employed during the deposition of the first layer 112 or collector region. This second layer 114 or base region is grown to a preferred thickness of about 1000 Angstroms, although the thickness may practically vary between about 500 Angstroms and one micron. It is not necessary that this base region 114 be as thick as the collector region 112 since stresses associated with mismatched crystallographic lattice constants due to different materials are not a concern. This is because this second cubic boron nitride layer 114 is surrounded by cubic boron nitride (layers 112 and 116).

The base region 114 is appropriately doped to be of opposite electrical conductivity type as compared to the collector region 112, therefore p-type conductivity for a preferred n-p-n type of bipolar transistor 100. Boron nitride may be made p-type by doping with beryllium, magnesium, or lithium. For a standard bipolar transistor 100, the level of p-type doping would be about $10^{15}$ cm$^{-3}$, but could be varied depending on the particular application. A p-type conductivity target (10 in FIG. 1) can be used to grow this p-type cubic boron nitride base layer 114 through the same mask used to form the base layer 112. Again, a possible means for doping this p-type base region 114 would be to utilize a beryllium-, magnesium-or lithium- doped boron nitride ceramic composite as the target (10 in FIG. 1) in the pulsed laser evaporation process. The level of doping within the target 10 would correspond to the desired application and level of doping within the base 114. Other possible methods would include conventional diffusion and ion implantation techniques.

A third thin film layer 116 of the epitaxial cubic boron nitride is then epitaxially grown from the epitaxial cubic boron nitride base 114 layer using the preferred pulsed laser evaporation method, however conventional methods such as reactive sputtering or ion beam deposition methods could also be used. This third epitaxial cubic boron nitride layer 116 is deposited using another mask which is smaller than the mask used to form the collector and base layers 112 and 114 respectively. This third layer 116 provides the emitter region for the bipolar transistor 100. This third layer 116 or emitter region is grown to a preferred thickness of about 1000 Angstroms, although the thickness may practically vary between about 500 Angstroms and one micron. This thickness is sufficient since stresses associated with mismatched crystallographic lattice constants due to different materials are not a concern, since the underlying layer 114 is also cubic boron nitride and there is no epitaxial growth overlaying this third layer 116.

Similarly, this emitter region 116 is appropriately doped to be of the same electrical conductivity type as the collector region 112 and accordingly of opposite conductivity type as the base region 114, therefore n-type conductivity for the preferred n-p-n bipolar transistor 100. This is accomplished by preferably doping the cubic boron nitride emitter region 116 with preferably silicon, sulfur or another column VI element. For a standard bipolar transistor 100, the level of n-type doping would be about $10^{15}$ cm$^{-3}$, but again could be doped using conventional techniques to any desired level for any particular application. As stated previously, a foreseeable manner in which to obtain this n-type emitter region 116 is to first form a silicon-doped boron nitride ceramic composite which can be used as the target (10 in FIG. 1) in the pulsed laser evaporation process. The level of doping within the target 10 would correspond to the desired application and level of doping within the emitter 116. Again, other possible methods for doping the emitter layer 116 n-type include conventional diffusion and ion implantation techniques.

Alternatively, a p-n-p bipolar transistor could be formed using these teachings, wherein the collector region 112 is appropriately doped p-type, the base region 114 is appropriately doped n-type and the emitter region 116 is appropriately doped p-type.

Lastly, electrically conductive metal contacts 118, 120 and 122 are formed by conventional metallization techniques so as to complete the preferred n-p-n bipolar transistor 100 by electrically contacting the collector 112, base 114 and emitter 116 regions respectively. The metal contacts 118, 120 and 122 may be formed from any of the conventional metals used in semiconductor applications, such as copper, silver or gold as well as others.

A bipolar transistor 100 formed from epitaxial cubic boron nitride has many potential advantages. A particularly advantageous feature of this invention is that the properties of the epitaxial cubic boron nitride material should enable the bipolar transistor to be particularly useful for high temperature applications. The relatively large electron valence band gap of cubic boron nitride, which is greater than about 6 electron volts, should enable a cubic boron nitride device to operate at extremely high temperatures, theoretically up to about 1000° C. or higher, since much thermal energy is required before the electrons will move between valences. In practice, the maximum operating temperatures will be significantly limited by the degradation of the metal contacts used to electrically connect the cubic boron nitride layers. However, even with this limitation, the cubic boron nitride transistor would be able to operate at temperatures up to about a few hundred degrees Centigrade, which is substantially higher than conventional devices.

In addition, it is noted that state-of-the-art bipolar transistors require lithographic resolution of less than one micron, and charge carrier channel regions of a similar dimension. These short channel lengths translate to electric field strengths of 50,000 Volts cm$^{-1}$ in logic devices and even greater field strengths in analog devices. The electric field strength of cubic boron nitride is greater than $10^7$ Volts/cm which is about 20 times larger than for silicon. Accordingly, the field strength of silicon limits the lithographic resolution while the field strength of cubic boron nitride will not. In principle therefore, devices made from cubic boron nitride can be made approximately 20 times smaller than those with silicon.

The lower atomic mass of the cubic boron nitride, as compared to silicon or germanium, indicates that the energies of the optical phonons, which are generated by crystallographic lattice vibrations, are much higher. Correspondingly, the velocities at which the charge carriers are scattered throughout the transistor by these optical phonons are much higher, and therefore the transit time across the transistor channel by these charge carriers is much shorter. A gain in transit time by a factor of 2 to 3 for the cubic boron nitride, as compared to the conventional silicon, germanium or even gallium arsenide is predicted. This translates directly into a bipolar transistor having a higher frequency response, another significant advantage.

Another significant advantage associated with the use of this cubic boron nitride bipolar transistor is that the crystallographic lattice constants between the underlying single crystal silicon substrate and the overlaying layers of cubic boron nitride are matched, therefore alleviating any stresses which may occur due to mismatched lattice constants. Also, since the thermal expansion coefficient of cubic boron nitride is similar to silicon over a large temperature range, thermally induced stresses due to differences in the coefficients of expansion are minimized. In addition, since cubic boron nitride is characterized by a relatively large dielectric breakdown voltage and superior thermal conductive properties, a bipolar transistor of cubic boron nitride should result in a higher device yield per silicon wafer since the cubic boron nitride transistors can be made smaller as compared to conventional transistors.

While our invention has been described in terms of preferred embodiments, it is apparent that other forms of the device could be adopted by one skilled in the art, such as by forming a p-n-p type of transistor, or such as by appropriately modifying the processing parameters so as to only use the laser evaporation method to grow the first layer of epitaxial cubic boron nitride upon the silicon substrate and then use conventional techniques such as ion beam or reactive sputtering methods, or such as appropriately doping the epitaxial cubic boron nitride films by introducing an appropriate gaseous phase during the deposition process. Accordingly, the scope of our invention is to be limited only by the following claims.

The embodiments of this invention in which an exclusive property or privilege is claimed are defined as follows:

1. A bipolar transistor comprising: a silicon substrate crystallographically oriented along the [100] crystallographic plane;
   an overlaying, appropriately doped collector region of cubic boron nitride in crystallographic registry with said silicon substrate;
   an appropriately doped, cubic boron nitride, base region overlaying said collector region, said base region being in epitaxial registry with said collector region;
   an appropriately doped, cubic boron nitride, emitter region overlaying said base region, said emitter region being in epitaxial registry with said base region; and
   electrical contacts to said collector region, said base region and said emitter region, such that a bipolar transistor useful for high temperature applications is provided.

2. A bipolar transistor as recited in claim 1 wherein said collector region and said emitter region are doped so as to be electrically n-type and said base region is doped so s to be electrically p-type, effective to provide a n-p-n type bipolar transistor.

3. A bipolar transistor as recited in claim 1 wherein said collector region and said emitter region are doped so as to be electrically p-type and said base region is doped so as to be electrically n-type, effective to provide a p-n-p type bipolar transistor.

4. A bipolar transistor comprising:
   an electrically conductive n+type silicon substrate crystallographically oriented along the [100] crystallographic plane;
   an overlaying, electrically conductive n-type collector region of cubic boron nitride in crystallographic registry with said silicon substrate;
   an electrically conductive p-type base region of cubic boron nitride overlaying said collector region, said base region being in epitaxial registry with said collector region;
   an electrically conductive n-type emitter region of cubic boron nitride overlaying said base region, said emitter region being in epitaxial registry with said base region; and
   electrical contacts to said collector region, said base region and said emitter region, such that a bipolar transistor useful for high temperature applications is provided.

5. A bipolar transistor comprising:
   a silicon substrate crystallographically oriented along the [100] crytallographic plane;
   an overlaying electrically conductive p-type collector region of cubic boron nitride in crystallographic registry with said silicon substrate;
   an electrically conductive n-type base region of cubic boron nitride overlaying said collector region, said base region being in epitaxial registry with said collector region;
   an electrically conductive p-type emitter region of cubic boron nitride overlaying said base region, said emitter region being in epitaxial registry with said base region; and
   electrical contacts to said silicon substrate; said base region and said emitter region, such that a bipolar transistor useful for high temperature applications is provided.

* * * * *